(12) United States Patent
Zhou et al.

(10) Patent No.: US 9,054,298 B2
(45) Date of Patent: *Jun. 9, 2015

(54) MAGNETIC RANDOM ACCESS MEMORY (MRAM) WITH ENHANCED MAGNETIC STIFFNESS AND METHOD OF MAKING SAME

(75) Inventors: Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 439 days.

This patent is subject to a terminal disclaimer.

(21) Appl. No.: 13/439,817

(22) Filed: Apr. 4, 2012

(65) Prior Publication Data
US 2012/0264234 A1    Oct. 18, 2012

Related U.S. Application Data

(63) Continuation-in-part of application No. 13/341,826, filed on Dec. 30, 2011, which is a continuation-in-part of application No. 13/238,972, filed on Sep. 21, 2011, now Pat. No. 8,758,850, which is a continuation-in-part of application No. 12/965,733, filed on Dec. 10, 2010, now Pat. No. 8,623,452.

(51) Int. Cl.
| | |
|---|---|
| H01L 43/12 | (2006.01) |
| H01L 43/10 | (2006.01) |
| H01F 10/32 | (2006.01) |
| H01F 41/30 | (2006.01) |
| B82Y 40/00 | (2011.01) |

(52) U.S. Cl.
CPC ............... *H01L 43/12* (2013.01); *H01L 43/10* (2013.01); *H01F 10/3295* (2013.01); *H01F 41/307* (2013.01); *B82Y 40/00* (2013.01); *H01F 10/329* (2013.01)

(58) Field of Classification Search
CPC ........ G11C 15/02; G11C 11/15; G11C 11/14; G11C 43/12
USPC ................. 427/127, 128, 129, 130, 131, 132; 360/324; 428/811, 811.3
See application file for complete search history.

(56) References Cited

U.S. PATENT DOCUMENTS

| | | | |
|---|---|---|---|
| 8,852,676 B2 * | 10/2014 | Zhou | 427/130 |
| 2002/0185196 A1 * | 12/2002 | Shin et al. | 148/108 |
| 2004/0060917 A1 * | 4/2004 | Liu et al. | 219/390 |

(Continued)

*Primary Examiner* — Micheal Cleveland
*Assistant Examiner* — Tabassom Tadayyon Eslami
(74) *Attorney, Agent, or Firm* — Maryam Imam; Bing K. Yen

(57) ABSTRACT

A spin transfer torque magnetic random access memory (STTMRAM) element and a method of manufacturing the same is disclosed having a free sub-layer structure with enhanced internal stiffness. A first free sub-layer is deposited, the first free sub-layer being made partially of boron (B), annealing is performed of the STTMRAM element at a first temperature after depositing the first free sub-layer to reduce the B content at an interface between the first free sub-layer and the barrier layer, the annealing causing a second free sub-layer to be formed on top of the first free sub-layer and being made partially of B, the amount of B of the second free sub-layer being greater than the amount of B in the first free sub-layer. Cooling down the STTMRAM element to a second temperature that is lower than the first temperature and depositing a third free sub-layer directly on top of the second free layer, with the third free sub-layer being made partially of boron (B), wherein the amount of B in the third sub-free layer is less than the amount of B in the second free sub-layer.

18 Claims, 5 Drawing Sheets

(56) References Cited

U.S. PATENT DOCUMENTS

| | | | |
|---|---|---|---|
| 2004/0169963 A1* | 9/2004 | Okuno et al. | 360/324.1 |
| 2005/0185455 A1* | 8/2005 | Huai | 365/171 |
| 2009/0121710 A1* | 5/2009 | Wang et al. | 324/252 |
| 2009/0162698 A1* | 6/2009 | Fukuzawa et al. | 428/811.2 |
| 2009/0229111 A1* | 9/2009 | Zhao et al. | 29/603.08 |
| 2014/0248719 A1* | 9/2014 | Zhou et al. | 438/3 |

\* cited by examiner

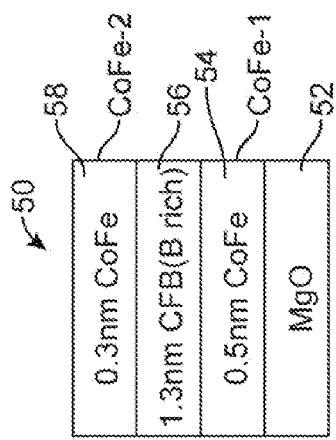
FIG. 2(a)
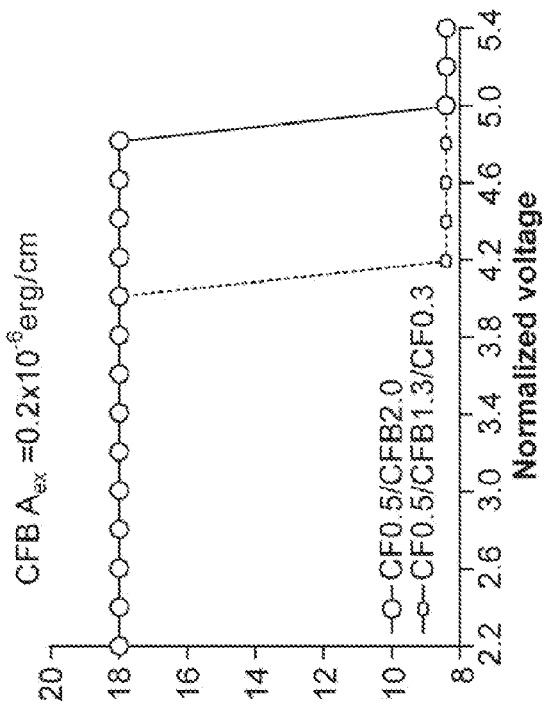
FIG. 2(b)
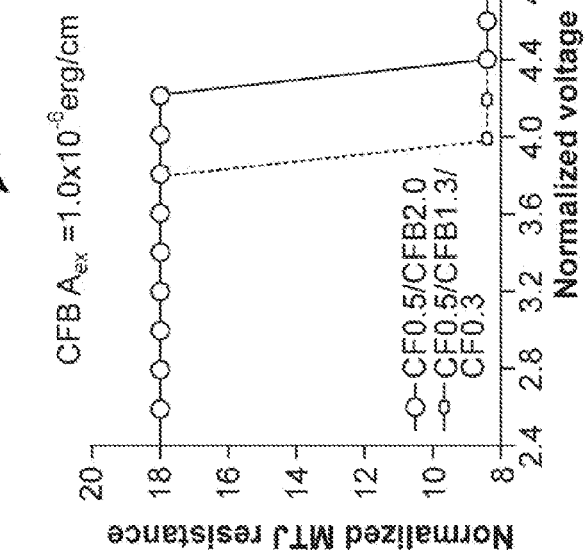

MAGNETIC RANDOM ACCESS MEMORY (MRAM) WITH ENHANCED MAGNETIC STIFFNESS AND METHOD OF MAKING SAME

CROSS REFERENCE TO RELATED APPLICATIONS

This application is a continuation-in-part of our previously-filed U.S. patent application Ser. No. 13/341,826, filed on Dec. 30, 2011, by Yuchen Zhou, et al., and entitled "MAGNETIC RANDOM ACCESS MEMORY (MRAM) WITH ENHANCED MAGNETIC STIFFNESS AND METHOD OF MAKING SAME", which is a is a continuation-in-part of our previously-filed U.S. patent application Ser. No. 13/238,972, filed on Sep. 21, 2011, by Zhou et al., and entitled "MAGNETIC RANDOM ACCESS MEMORY (MRAM) WITH ENHANCED MAGNETIC STIFFNESS AND METHOD OF MAKING SAME", now U.S. Pat. No. 8,758,850 which is a continuation-in-part of our previously-filed U.S. patent application Ser. No. 12/965,733 filed on Dec. 10, 2010, by Zhou et al., and entitled "ENHANCED MAGNETIC STIFFNESS AND METHOD OF MAKING SAME" now U.S. Pat. No. 8,623,452.

BACKGROUND OF THE INVENTION

1. Field of the Invention

The present invention relates generally to magnetic memory elements having magnetic tunnel junctions (MTJ) and particularly to improving the internal magnetic stiffness of the free layer of the MTJ to reduce threshold voltage/current during writing thereto.

2. Description of the Prior Art

Magnetic random access memory (MRAM) is rapidly gaining popularity as its use in replacing conventional memory is showing promise. Magnetic tunnel junctions (MTJs), which are essentially the part of the MRAM that store information, include various layers that determine the magnetic behavior of the device. An exemplary MTJ uses spin torque transfer to effectuate a change in the direction of magnetization of one or more free layers in the MTJ. That is, writing bits of information is achieved by using a spin polarized current flowing through the MTJ, instead of using a magnetic field, to change states or program/write/erase/read bits.

In spin torque transfer (STT) MTJ designs, when electrons flow across the MTJ stack in a direction that is perpendicular to the film plane or from the pinned (sometimes referred to as "reference" or "fixed") layer to the free (or storage) layer, spin torque from electrons transmitted from the pinned layer to the free layer orientate the free layer magnetization in a direction that is parallel to that of the reference or pinned layer. When electrons flow from the free layer to the pinned layer, spin torque from electrons that are reflected from the pinned layer back into the free layer orientate the free layer magnetization to be anti-parallel relative to the magnetization of the pinned layer. Thus, controlling the electron (current) flow direction, direction of magnetization of the free layer magnetization is switched. Resistance across the MTJ stack changes between low and high states when the free layer magnetization is parallel or anti-parallel relative to that of the pinned layer.

However, a problem that is consistently experienced and that prevents advancement of the use of MTJs is the threshold voltage or current used to switch the free layer magnetization. That is, such current and threshold voltage requirements are currently too high to allow practical applications of the spin torque transfer based MTJ.

Existing MTJ designs include a free layer, generally made of a cobalt-iron-boron (CoFeB) alloy, formed on top of a barrier layer, which is typically formed on top of the pinned (or fixed) layer. Prior to annealing, the thickness of the CoFeB is typically approximately one to a few nanometers. After annealing, the free layer separates into two distinct layers, one of such layers, closest or adjacent to the barrier layer, is formed with CoFe whereas the other of such layers, farthest and removed from the barrier layer, is made of CoFeB with a rich boron (B) content. The thickness of these layers is typically approximately 0.5 nm or less for the layer that is made of CoFe and the other one of the layers that has a rich B content has a thickness that is the thickness of the free layer minus the thickness of the layer that is made of CoFe, or in the example provided above, 2 nm. Due to this formation, when annealing is performed, such MTJs exhibit a considerable low stiffness. Thus, during programming or writing to the MTJ, the amount of threshold voltage required to switch the MTJ is undesirably high. For example, an MTJ such as that described above with the material an increase in internal stiffness of approximately $0.8 \times 10^{-6}$ erg/cm, in its CoFeB part of its free layer after annealing, with a normalized switching reducing approximately 16%, in large part due to the layer of the free layer that is farthest removed from the barrier layer, the CoFeB part of the free layer.

Thus, the need arises for enhanced internal stiffness of the free layer of a spin torque transfer-based MTJ, used in a magnetic memory element, to reduce the threshold voltage or current required to switch the free layer magnetization of such MTJs.

SUMMARY OF THE INVENTION

Briefly, a spin transfer torque magnetic random access memory (STTMRAM) element and a method of manufacturing the same is disclosed having a free layer structure with enhanced internal stiffness. Some of the steps of manufacturing include depositing a first free sub-layer on top of a barrier layer, the first free sub-layer being made partially of boron (B), annealing the STTMRAM element at a first temperature after depositing the first free sub-layer to reduce the B content at an interface between the first free sub-layer and the barrier layer. The annealing causes a second free sub-layer to be formed on top of the first free sub-layer, the second free sub-layer being made partially of B, the amount of B of the second free sub-layer being greater than the amount of B in the first free sub-layer. Cooling down the STTMRAM element to a second temperature that is lower than the first temperature and depositing a third free sub-layer directly on top of the second free sub-layer, with the third free sub-layer being made partially of boron (B), wherein the amount of B in the third sub-free layer is less than the amount of B in the second sub-free layer or void of B.

These and other objects and advantages of the present invention will no doubt become apparent to those skilled in the art after having read the following detailed description of the various embodiments illustrated in the several figures of the drawing.

IN THE DRAWINGS

FIG. 2(a) shows the relevant portion of a STTMRAM element 50, in accordance with an embodiment of the present invention.

FIG. 2(b) shows a graph 60, representing the switching characteristics of the element 50 vs. the switching characteristics of a prior art STTMRAM element, both having CFB layer exchange of $1\times10^{-6}$ erg/cm, and further shows a graph 62, representing the switching characteristics of the element 50 vs. the switching characteristics of a prior art STTMRAM element, both having CFB layer exchange of $0.2\times10^{-6}$ erg/cm.

Figure 3:
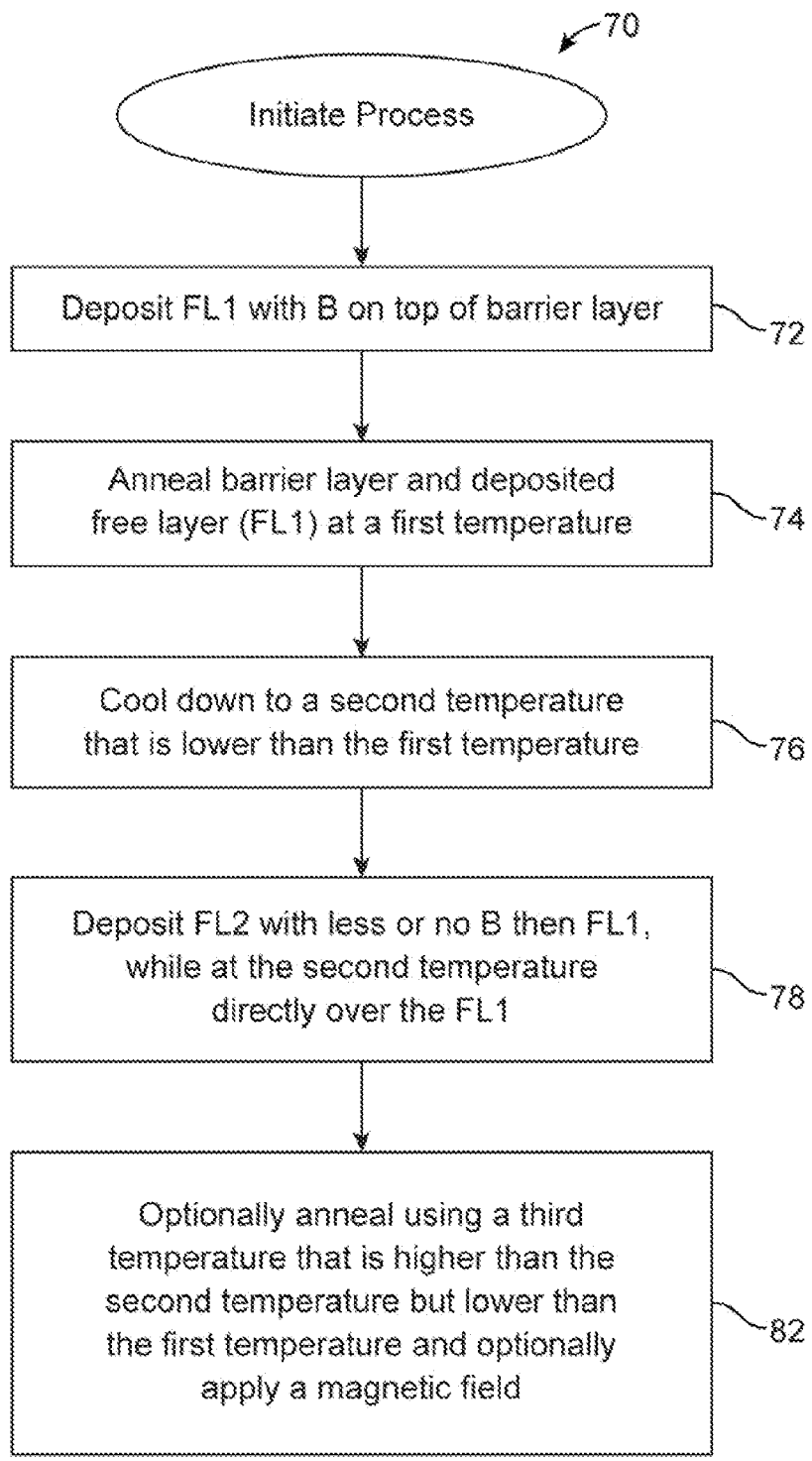

FIG. 3 shows a flow chart of the steps performed in manufacturing the various embodiments of the present invention, in accordance with a method of the present invention.

Figure 4:
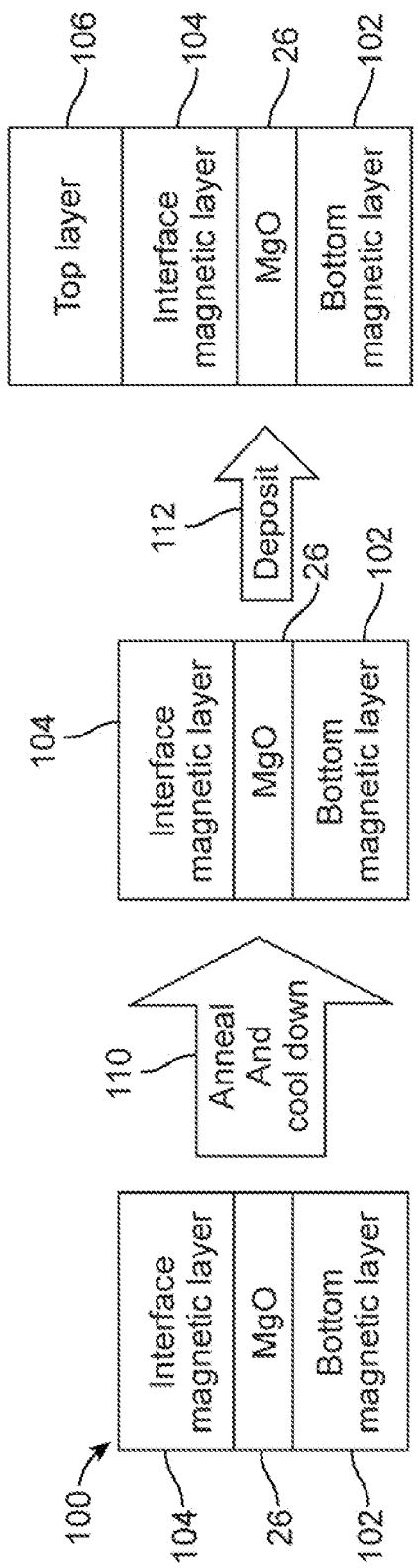

FIG. 4 shows the process of enhancing the free layer of a STTMRAM 100, using a method of the present invention.

Figure 5:
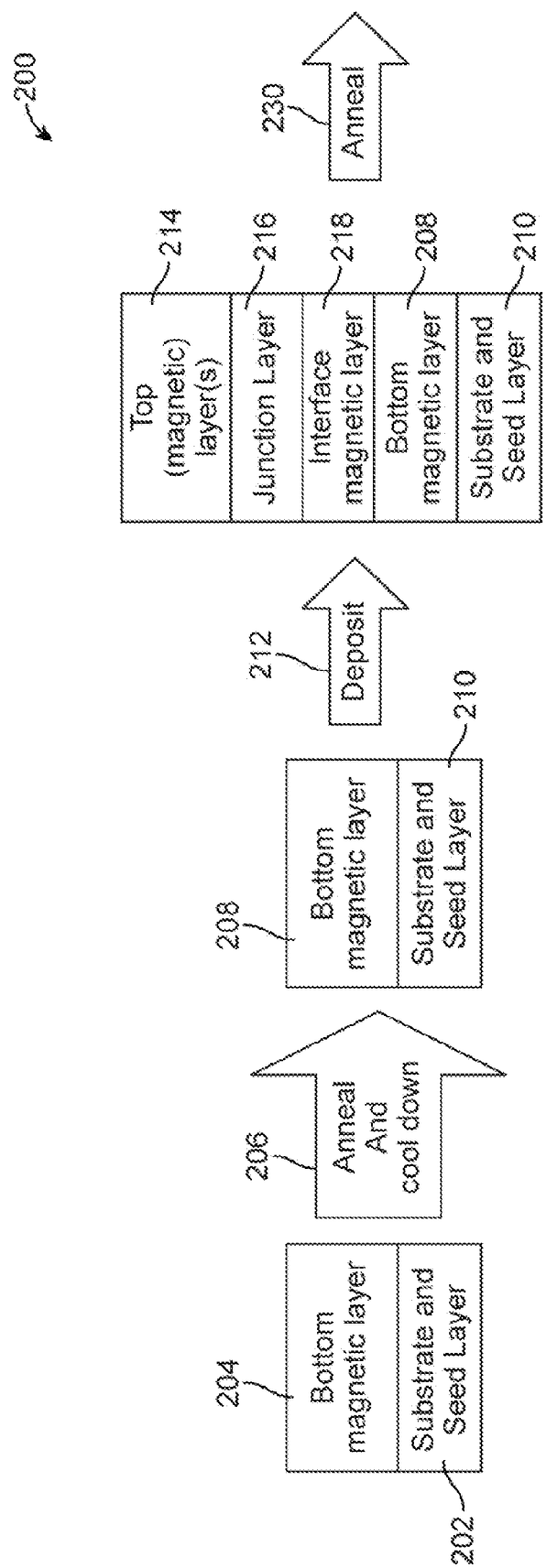

FIG. 5 shows a process for making and structure of a STTMRAM 200, in accordance with another method and apparatus of the invention.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a spin transfer torque magnetic random access memory (STTMRAM) element and a method of manufacturing the same is disclosed. Relevant layers of the STTMRAM element include a free layer structure, having enhanced internal stiffness, and made of sub-layers using an annealing process. In forming the free layer structure, a first free layer is deposited on top of a barrier layer, the first free layer being made partially of boron (B), then, an annealing process is performed on the STTMRAM element at a first temperature and after depositing the first free sub-layer to reduce the B-content of the deposited first free sub-layer, at an interface between the first free sub-layer and the barrier layer. This annealing process causes the B in the first free sub-layer to migrate from the interface between the first free sub-layer and the barrier layer to the top of the first free sub-layer and away from the barrier layer. The STTMRAM element is then cooled to a second temperature that is lower than the first temperature and a second free sub-layer is deposited directly on top of the first free sub-layer, with the second free sub-layer being made partially of B or void of B, wherein the amount of B in the second sub-free layer is less than the amount of B in the first free layer.

In an alternative embodiment, after deposition of the second free sub-layer, another annealing process is performed using a third temperature that is higher than the second temperature and lower than the first temperature.

Figure 1:
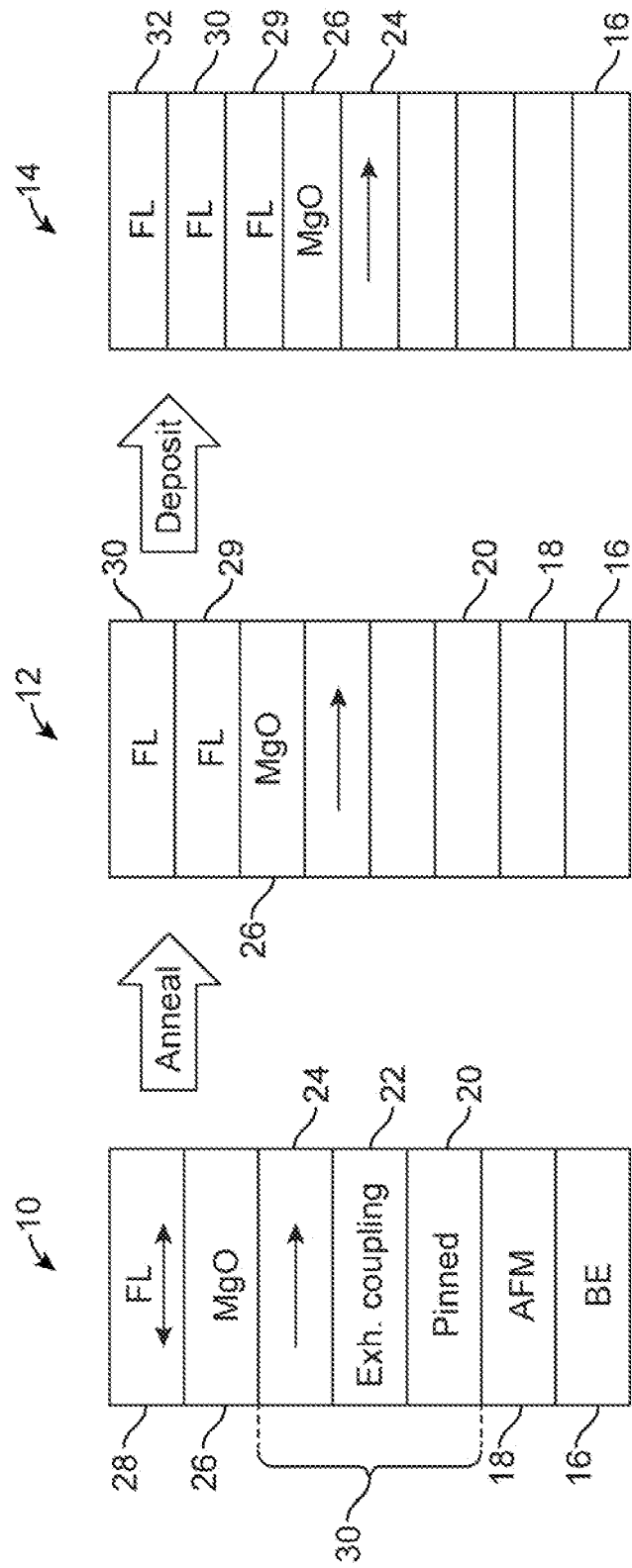
FIG. 1 shows the process of enhancing the free layer of a STTMRAM 10, using a method of the present invention.

FIG. 1 shows the process of enhancing the free layer of a spin torque transfer magnetic random access memory (STTMRAM) element 10, using a method of the present invention. The STTMRAM element 10 is shown initially (at the far left of FIG. 1) to include a bottom electrode 16 on top of which is formed an anti-ferromagnetic (AFM) layer 18 on top of which is shown formed a pinned layer 20 (sometimes referred to as "pinning layer"), on top of which is shown formed an exchange coupling layer 22, on top of which is shown formed a reference layer 24 on top of which is formed a barrier layer 26 on top of which is formed a (magnetic) free layer 28. The pinned layer 24, the barrier layer 26 and the (magnetic) free layer 28 (in addition to other free layers directly formed on top of the free layer 28, such as the free layer 30) are collectively referred to as "magnetic tunnel junction (MTJ)". Deposition of the layer 28 on top of the layer 26 forms a "magneto-resistive junction". It is noted that the layers 24, 28, 29 and 30 are each, at times, referred to herein as "magnetic layer".

In alternative embodiments, the element 10 (and the element 50 shown in FIG. 2(a)) is a magneto-resistive (MR) element.

The layer 26 (also referred to as a "junction layer"), in some embodiments, is made of oxide and in other embodiments is metallic.

The pinned layer 20 and the exchange coupling layer 22 and the reference layer 24, which is also commonly referred to as the reference layer (sometimes referred to as "pinned layer" or "fixed layer"), are collectively referred to as a "synthetic-antiferromagnetic (SAF) layer".

The layer 28 includes B as one of its material, as discussed below.

Upon annealing, as will be described in further detail below, the STTMRAM element 10 takes on the structure shown in the middle of FIG. 1 with the free layer 28 becoming a layer that is formed of sub-layers, an interface layer 29, immediately abutting the barrier layer 26, and a boron-rich layer 30. The layer 29 in one embodiment of the present invention has an effective thickness that is less than 1 nm and further has a lower boron (B) content than the free layer 28 and is positioned directly on top of the layer 26, effectively interfacing with this layer. The layer 30, does not interface with the layer 26 and is in fact positioned above the layer 29 and accordingly removed from the layer 26. The layer 30 has a higher boron (B) content than the free layer 28. Subsequently, as shown on the far right side of FIG. 1, another free layer, free layer 32 is deposited directly on top of the free layer 30. The layer 32, in one embodiment of the present invention has no B content and in another embodiment, has a B content that is less B content than that of the layer 30.

It is understood that layers typically formed on top of a free layer in STTMRAM elements are formed on top of the free layer 32. An example of such a layer is a top electrode.

The process shown and described relative to FIG. 1 serves to enhance the effective within-film exchange strength of the free layer.

The steps discussed above, relative to FIG. 1, are now described in further detail with exemplary materials disclosed regarding each of the layers. The barrier layer 26, in an exemplary embodiment, is made of magnesium oxide (MgO). The free layer 28, in exemplary embodiments is made, but not limited to, cobalt (Co), iron (Fe), nickel (Ni), boron (B), tantalum (Ta), titanium (Ti), copper (Cu), zirconium (Zr), chromium (Cr) and platinum (Pt). The free layer 28 may be formed as a uniform composition single layer or formed as a multi-layer structure where the layer adjacent to and on top of the barrier layer 26 is a different composition than the layer further away from the barrier layer 26. One example of such multi-layer structure of the free layer 28 can be, but not limited to, a thin CoFeBX layer, with X being any of Ni, B, Ta, Ti, Cu, Zr, Cr and Pt, that is in one example less than 1 nanometers (nm) in thickness, with its Fe content being approximately 60%. In another embodiment, such a layer has a thicker of more than 1 nano meters CoFeBY layer with Fe content ≤40%, where X and Y can be any of Ni, B, Ta, Ti, Cu, Zr, Cr and Pt.

During the annealing step discussed above, the barrier layer 26 and the free layer 28 are annealed and as such are referred to herein as the "annealed structure". Annealing is performed under normal MTJ annealing condition, which is annealing the structure under a first temperature that is approximately more than or equal to 200 degrees Celsius (° C.) and less than or equal to 500° C., and preferably 270° C.~350° C. for a period of a few minutes up to a few hours. During annealing, there may also be a first magnetic field applied to the annealed structure.

After the annealing step, the STTMRAM element 10 is cooled down to a second temperature that is lower than the first temperature. Due to the annealing process, the barrier layer 26 forms a crystalline structure and the free layer 28 also forms crystalline structure at the interface between the barrier layer 26 and the free layer 28 with B being pushed away from the interface and forming the layer 29 in structure 12 of FIG. 1, and another B rich layer 30 above layer 29.

The free layer 29 has lower B content, and the free layer 30 has a higher B content, than that of the free layer 28. At the second temperature, the free layer 32 is deposited on top of the free layer 30. As exemplary materials, the free layer 32 is made of: Co, Fe, Ni, B, Ta, Ti, Cu, Zr, Cr or Pt. The free layer 32 typically has between 80%-100% content of any of the following materials: Co, Fe and Ni. After deposition of the free layer 32, additional non-magnetic and magnetic layers that are required to make a functional the STTMRAM element 10 can be further deposited on top of the free layer 32. The free layer 32 may also be a multi-layered free layer and in such example, is made of two free layers. In fact, additional free layers, either in the form of a single layer or in the form of multiple layers may be utilized with each such layer formed on top of an adjacent free layer.

After completion of deposition of the rest of the STTMRAM element 10, as shown and discussed relative to FIG. 1, the entire STTMRAM element may optionally undergo another annealing step with a third temperature that is higher than the second temperature but lower than the first temperature.

For a typical MgO-based MTJ, the free layer is composed of Co, Fe, B, and sometimes other materials, for example, Ti, Ta, Cr, Ni, is deposited adjacent to the barrier layer 26, which is usually amorphous after deposition. After a high temperature (>200° C.) anneal process of the methods described herein, the barrier layer 26 forms a lattice structure, which in turn helps form a thin layer of CoFe with a lattice structure matching that of the barrier layer to be formed at the interface between the free layer and the barrier layer. The matching lattice structures of the barrier layer and free layer produces a high magneto-resistance signal through the barrier layer in a typical MgO-based MTJ. However, the free layer 30 that is away from the free layer-barrier layer interface ("upper free layer") typically has less Co and Fe content than when initially deposited because B is depleted from the interface region and migrates to the upper free layer. With B content increasing in the upper free layer after annealing, the upper free layer is regarded more amorphous than after deposition, where CoFe crystalline nano-structures may exist in the upper free layer in uniform distribution but random orientation. Neighboring CoFe crystals affect each other less through crystalline exchange coupling, which requires overlapping of electron clouds from adjacent atoms, due to increased spacing by B and random orientation. Rather, they affect each other more through magneto-static coupling, which is a much weaker energy term than exchange energy. With weak exchange interaction between CoFe crystals within the upper free layer, dynamic switching process of the upper free layer together with the interface layer 28 is more chaotic and less uniform, where higher order spin-wave modes can be easily excited due to weak effective exchange energy within the free layer. The higher order spin-wave mode is generally an energy relaxation path, which will adversely slow down the switching process of the free layer by transferring the spin torque injected energy to other higher order spin-wave modes not related to the switching process. Therefore, it is beneficial if the effective internal exchange energy (or internal stiffness) of the free layer (or switching layer, including layer 29 and layer 30) can be increased so that higher order spin wave mode can be suppressed and energy dissipation during switching process can be reduced.

In accordance with the various embodiments of the present invention, easier switching of the storage magnetic layer by spin torque current with reducing effective damping of the free layer is realized by increasing the effective internal stiffness of the free layer, random modes during switching are suppressed and coherent mode is enhanced. With more coherent behavior of the magnetization of the free layer during switching process, spin torque efficiency is increased, effective damping is dropped and switching becomes easier. Any STTMRAM element design with any shape is contemplated. This method is to achieve lower switching current in STTMRAM by quenching the additional damping effect from low internal stiffness of the free layer.

FIG. 2(a) shows the relevant portion of a STTMRAM element 50, in accordance with an embodiment of the present invention. The STTMRAM element 50 is analogous to the STTMRAM element 14 except that the barrier layer and the free layer of the STTMRAM element 50 are shown and described in more particular detail, as is discussed below.

The STTMRAM element 50 is shown to include a barrier layer 52, which would be formed on top of the layer 24 of the element 14, in addition to a free sub-layer 54, formed on top of the layer 52, a free sub-layer 56, formed on top of the sub-layer 54, and a free sub-layer 58, formed on top of the sub-layer 56. The sub-layers 54-58 form the free layer of the STTMRAM element 50.

As in FIG. 1, the element 50 may be a magneto-resistive (MR) element in some embodiments and the layer 52 may be a "junction layer" made of oxide or is metallic. Deposition of the layer 54 on top of the layer 52 forms a magneto-resistive junction.

Upon the completion of an annealing step, such as described relative to FIG. 1, the free layer of the STTMRAM element 50 is transformed into multiple sub-layers, namely, an interface layer (also referred to herein as "free sub-layer") 54, the free sub-layer 56 and the free sub-layer 58, as shown in FIG. 2(b). The free sub-layer 54 is made of a CoFe composition having a thickness of approximately 0.5 nm, with B being mostly depleted. The sub-layer 56 becomes rich in B and is directly on top of the sub-layer 54 and is approximately 1.3 nm in thickness. The sub-layer 58, which is formed directly on top of the sub-layer 56 is made of CoFe and has an approximate thickness of 0.3 nm.

The element 50 achieves stronger free layer within-film exchange strength with the benefit of the sub-layer 58 being capped on top of the sub-layer 56. This is at least in part realized by the notion that the total Mst, which is the saturation moment (Ms) times thickness, of the free layer (including sub-layer 54, 56 and 58), after annealing, is advantageously the same as those of prior art STTMRAM elements. With the MTJ shape of the element 50 not changing, effective anisotropy of the free layer and thermal stability related to the effective anisotropy also remain unchanged. However, because the sub-layer 58 has a within-film exchange of Aex=$2\times10^{-6}$ erg/cm, the free layer's effective within-film exchange is higher than that experienced by prior art STTM-RAM elements because the sub-layer 56, which is rich in B, is coupled to the sub-layers 54 and 58, which are high exchange CoFe layers on either side of the sub-layer 56 and the high exchange CoFe layers, i.e. sub-layers 54 and 58, determine more of the dynamics of the switching process.

FIG. 2(b) shows a graph 60, representing the switching characteristics of the element 50 vs. the switching characteristics of a prior art STTMRAM element, both having CFB layer exchange of $1\times10^{-6}$ erg/cm, and further shows a graph 62, representing the switching characteristics of the element 50 vs. the switching characteristics of a prior art STTMRAM element, both having CFB layer exchange of $0.2\times10^{-6}$ erg/cm. The x-axis of each graph represents the normalized switching voltage and the y-axis shows the normalized MTJ resistance. The solid lines with circles prior art and the dashed lines with dots represent the element 50.

The curves of each graph 60 and 62 are the MTJ resistance after application of a given voltage for 5 nanoseconds (ns) to try to switch the MTJ from high resistance state to low resistance state. The step function shape of each of the graphs 60 and 62 represents a switching event, where the voltage at which the switching event occurs is the switching voltage threshold. By using the sub-layer 58, the switching voltage is reduced by 9% over prior art in the case of free layer Aex=$1\times10^{-6}$ erg/cm, as shown by the graph 60, and 16% over prior art in the case of free layer Aex=$0.2\times10^{-6}$ erg/cm, as shown by the graph 62. Thus, using the sub-layer 58, the lower the B-rich free layer within-film exchange, the larger the performance improvement realized by reduction of the switching voltage. In fact, the switching voltages as shown by the dashed curves in the graphs 60 and 62 show little difference, indicating that when the sub-layer 58 is used, the sub-layer 56's within-film exchange strength is not a critical parameter any more.

However, the structure whose behavior is exhibited as shown by the graph 62 is not readily realizable with existing film processing technology. For example, if the sub-layer 58 of 0.3 nm thickness is deposited directly on top of the sub-layer 56 and annealing is performed on the film to form the sub-layer 54 of 0.5 nm in thickness and the B-rich sub-layer 56 of 1.3 nm in thickness, the high temperature used to obtain a suitable barrier layer and CoFe crystalline structure will inevitably cause B migration into the sub-layer 58 causing it to be undesirably amorphous-like and reducing the within-film exchange of the sub-layer 58. Thus, the "glue" purpose by the CoFe-2 layer is defeated. In accordance with a method of the present invention, a two-step deposition process is disclosed to achieve the switching current density reduction as in the various embodiments thereof.

To take advantage of lower switching voltage threshold, the free layer's effective within-film exchange needs to be increased. However, since CoFeB is required for crystalline forming of CoFe interface layer and self-alignment of CoFe lattice to that of the MgO after annealing, CoFeB low exchange material is still required for high TMR ratio MgO MTJ.

FIG. 3 shows a flow chart of the steps performed in manufacturing the various STTMRAM elements of the present invention, in accordance with a method of the present invention. Examples of such STTMRAM elements are the elements 14 and 50.

During the process of manufacturing the STTMRAM element, various layers are deposited on top of one another as shown in FIG. 1 and the steps of FIG. 3 pick up the formation of figures starting from deposition of the barrier layer. The steps of flow chart 70 therefore show only those steps performed after the barrier layer has been deposited. At step 72, a free layer (FL1), such as the free layer 28 of FIG. 1 is deposited on top of the deposited barrier layer. In FIG. 2(a), this layer is the sub-layer 54.

Next, at step 74, an annealing process is performed, using a first temperature, on the STTMRAM element, as formed thus far. In an exemplary method, the first temperature used at step 74 is approximately more than or equal to 200 degrees Celsius (° C.) and less than or equal to 500° C. Accordingly, the deposited barrier layer and FL1 are annealed as well. Next, at step 76, the STTMRAM element is cooled down to a second temperature that is lower than the first temperature. At this point, two sub-layers are formed, such as the layers 29 and 30 in FIG. 1 or the sub-layers 54 and 56 in FIG. 2(a).

Next, at step 78, another free layer, FL2, is deposited over the FL1 while the STTMRAM element is at the temperature of step 76. In FIG. 2(a), the FL2 is the sub-layer 58 and in FIG. 1, the FL2 is the layer 32. Next, at step 82, another annealing process is performed using a third temperature that is higher than the second temperature but lower than the first temperature.

Optionally, additional non-magnetic and magnetic layers are deposited on top of the FL2, as may be suited and optionally a magnetic field is applied to the STTMRAM element thereby improving the magnetic property of the FL2.

FIG. 4 shows relevant layers of a STTMRAM element 100, in accordance with another embodiment of the invention. The element 100 is also referred to herein as a STTMRAM MTJ film stack. The element 100 is shown to include a bottom magnetic layer (BML) 102 formed below the layer 26 and an interface magnetic layer (IML) 104 formed on top of the layer 26. The BML is analogous to the layer 24 of FIG. 1 and the layer 104 is analogous to the layer 28 of FIG. 1. The following process is performed when making the element 100. The layer 26 and the layer 104 collectively comprise at least part of the MTJ of the element 100.

Upon depositing the layer 104 on top of the layer 26, the temperature (also referred to herein as "first temperature") being applied to the element 100 is increased followed by annealing at 110, preferably in-situ within the same deposition system without breaking the vacuum to avoid oxidization and contamination of the surface of the layer 104. Still at 110, in FIG. 4, the temperature being applied to the element 100 is reduced (the reduced temperature is also referred to herein as the "second temperature") and the remaining layers are deposited on top of the layer 104, which in FIG. 4, includes deposition of a top surface layer 106. The layer 106 is deposited on top of the layer 32 in accordance with some embodiments of the invention. After depositing the layer 106, optionally, a second annealing process is performed at a temperature that is higher than the second temperature.

The aforementioned in-situ annealing on STTMRAM element 100, in some embodiments, is manufactured by increasing the substrate temperature by a heating block, a heating chuck or a heating plate located below the substrate. It can also be achieved by heating the wafer from above the substrate with a light source, for example a lamp or a laser. It is also desirable to be able to quickly increase the effective temperature and quickly reduce the effective temperature on the MTJ devices with a Rapid Thermal Anneal (RTA) process, where the entire heating and cooling cycle finishes in a time scale of less than 10 minutes, and most preferable less than 2 minutes. The RTA process can significantly enhance the preferred crystalline growth in the MgO layer 26, the bottom magnetic layer 102, and the interface magnetic layer 104, that will help achieve higher TMR value of the MTJ. This preferred crystalline growth enhancement by the RTA process, can also reduce the adverse effect of the crystalline lattice interference between the MTJ junction structure, which contains layer 26, layer 102 and layer 104, and the layers in the MTJ stack that are further away from the MgO layer 26, such as the top layer 106. Thus, the overall MTJ performance can be enhanced.

Each of the layers 102 and 104 can have an in-plane or a perpendicular magnetization relative to the film plane. In some embodiments, the layer 106 is made of magnetic material, in other embodiments, it is made of non-magnetic material and in still other embodiments, it is interlaced with magnetic and non-magnetic materials. In some embodiments, the layer 104 is composed of a multilayer structure with magnetic layer and non-magnetic layer where at least one of these magnetic layers interfaces with the layer 26.

In some embodiments, the layer 104 has a multi-layer structure made of magnetic and non-magnetic layers where at least one of these magnetic layers forms the top surface of layer 104, and is made of any combination of, but not limited to, the following materials: Co, Fe, B, Ni, Ta, Pd, Ru, Mg, O, Tb, Pt, Ti, Cu, Zr, Mn, Ir, or Hf.

The layer 102, in some embodiments, is made of underlying magnetic or non-magnetic layers that are not shown in FIG. 4. In some embodiment, the layer 104 and the layer 102 each have boron content, and either one or both are made of a single composition magnetic layer or have a multilayer structure with each layer of the multi-layer having a distinct boron content, ranging from 0~90% of the composition of the layer 104. In some embodiments, the layers 102 and 104 are each composed of boron (B) with any combination of the following materials: Co, Fe, Ta, Ti, Ni, Cr, Pt, Pd, Tb, Zn, O, Cu or Zr.

FIG. 5 shows a process for making and structure of a STTMRAM element 200, in accordance with another method and apparatus of the invention. In FIG. 5, the element 200 is shown to start with a substrate, during manufacturing, on top of which is optionally deposited (in embodiments where layer 204 is formed) the seed layer 202 (this is also referred to herein as substrate and seed layer 202), on top of which is formed a bottom magnetic layer 204. At 206, the temperature is increased above the temperature at which the bottom magnetic layer 204 is deposited on the layer 202 and the structure including the layer 204 is annealed, in some embodiments, in-situ, within the same deposition system without breaking the vacuum to avoid oxidization and contamination of the top surface (the surface that is in opposite to the surface that is in direct contact with the layer 202) of the layer 204.

Next, the temperature is decreased to a temperature that is at least lower than that of the increased temperature at 206 and upon the completion of this step, the annealed substrate and seed layer 210 and the bottom magnetic layer 208 emerge. Next, at 212, additional layers are deposited. That is, an interface magnetic layer 218 is deposited on top of the layer 208, a junction layer 216 is deposited on top of the layer 218, and a top layer 214 is deposited on top of the layer 216 to form the STTMRAM 200. The layer 214, in some embodiments, is magnetic, and made of multiple layers. In some embodiments, the layer 214 is analogous to the combined structure of the layer 104 and the layer 106 of FIG. 4.

Optionally, the element 200 is further annealed, at 230 and after the deposition of all relevant layers, at a temperature that is higher than that used for deposition at 212. Such annealing helps improve the magneto-resistive signal from the STTMRAM and also helps achieve higher anisotropy of the layer 214.

Stiffness of the layer 208 of the STTMRAM element 200 is advantageously improved and the overall quality of the layer 216, due to the annealing process at 206, offer advantages enjoyed by the layers 208 and 218, as follows.

The in-situ annealing process, at 206, promotes crystalline formation in the layer 208. Thus, elements of the layer 208 are more tightly bound within the layer 208 by the crystalline structure and do not migrate easily to the layer 218 or to the layer 216 during follow-on process(es) of manufacturing. Thus, less damage to the stiffness of the layer 218 results and less degradation on the overall quality of the MTJ junction is achieved.

Additionally, in cases where the element 200 has perpendicular anisotropy, this in-situ annealing helps promote the perpendicular anisotropy of the layer 208 while not being affected by the lattice structure propagating from the junction area, or the layer 216. In convention processes, where the MRAM stack is first formed (all layers are deposited) and then annealing is performed, the lattice structure of the layer 208 is affected by the junction area's lattice structure and perpendicular anisotropy is not well maintained.

Further, the advantage is especially beneficially in an STT-MRAM element that is based on perpendicular MTJ, where magnetization of the magnetic layers is perpendicular to film plane. In cases where the layer 208 is made of Co/Pd or Co/Pt and conventional methods of manufacturing are employed with annealing performed at the end of deposition, these materials help promote perpendicular anisotropy but nearly destroy the magnetic property of the layer 218 and MTJ junction quality in conventional process of finishing whole stack deposition and then anneal. Whereas, the method herein of annealing prior to the deposition of additional layers, yields higher anisotropy from layer 208 while avoiding the foregoing damaging effect on the layer 218.

The aforementioned in-situ annealing on STTMRAM element 200, in an exemplary method of manufacturing is done by increasing the substrate temperature by a heating block, a heating chuck or a heating plate located below the substrate. It can also be achieved by heating the wafer from above the substrate with a light source, for example a lamp or a laser. It is also desirable to quickly increase the effective temperature and quickly reduce the effective temperature on the MTJ devices with a Rapid Thermal Anneal (RTA) process, where the entire heating and cooling cycle finishes in a time scale of less than 10 minutes, and most preferable less than 2 minutes. The RTA process can enhance the preferred crystalline growth in the bottom magnetic layer 208, which will help achieve better magnetic properties of layer 208. This preferred crystalline growth enhancement by the RTA process, can also reduce the adverse effect of the crystalline lattice interference between the MTJ junction structure, which contains layer 214, layer 216 and layer 218, and the bottom magnetic layer 208. Thus, the overall MTJ performance can be enhanced.

The layer 216 is magneto-resistive, which in some embodiments is made of a metallic layer, for example, Cu, Au, Ag, and in some embodiments is made of an insulator layer, for example, oxide of Mg, Al, Ti or Zn, and in some embodiments is made of a layer that is made of metallic pillars dispersed within an insulator layer.

In some embodiments, the layers 208, 218, and 214, each have magnetization that is in-plane and in some embodiments, they each have a perpendicular magnetization relative to the film plane.

In some embodiments, the layer 208 is a single magnetic layer and in other embodiments, it is made of multiple layers, such as magnetic and non-magnetic sub-layers interlaced. In those embodiments where the layer 208 is made of multiple layers of magnetic and non-magnetic layers, the magnetic layers are made of Co, Fe, CoFe, or CoFeB, and the non-magnetic layers are made of Pt or Pd. In other embodiments, the multiple layers of the layer 208 may include repeated layers of Co and Ni, or CoFe and Ni, or CoFeB and Ni. Further in those embodiments where the layer 208 is made of multiple layers, the top-most layer of the layer 208 that is in contact with the layer 218 is a layer made of any of the following materials: Co, Fe, B, Ta, Ti, Ni, Cr, Pt, Pd, Tb, Zn, O, Cu, or Zr.

In some embodiments, the layer 218 is made of multiple layers and in those embodiments, the bottom-most layer of the layer 218 that is in contact with the layer 208 is made of any of the following layers: Co, Fe, B, Ta, Ti, Ni, Cr, Pt, Pd, Tb, Zn, O, Cu, or Zr. In some embodiments, the layer 218 is made of material containing boron (B) with B making up anywhere from 0 to 90% of the layer 218.

In some embodiments, the layer 218 and the layer 208 are each made of any combination of the following material: Co, Fe, B, Ta, Ti, Ni, Cr, Pt, Pd, Tb, Zn, O, Cu, or Zr.

In some embodiments, the layer 216 acts as a barrier layer, the layer 214 acts as a pinned or fixed layer whose magnetization is fixed in a given direction after magnetization, and the layer 208 and layer 218 collectively act as a free layer whose magnetization switches relative to that of the layer 214. In other embodiments, the layer the layer 208 and layer 218 collectively act as a pinned or fixed layer whose magnetization is fixed in a given direction after magnetization, and the layer 214 acts as a free layer whose magnetization switches relative to that of the layer 208.

In still other embodiments, metallic pillars are formed between the layer 214 and the layer 218, going through the layer 216, and each of these metallic pillars is surrounded by non-metallic material. In accordance with an embodiment of the invention, the metallic pillars are made of one of the materials: Cu, Ag, or Au, and the non-metallic material are made of oxide, for example, Mg, Al, Zn, or Ti.

It is understood that requisite seed layers may be formed between the layer 208 and the substrate on top of which the layers of the element 200 are formed.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of manufacturing a spin transfer torque magnetic random access memory (STTMRAM) magnetic tunnel junction film stack comprising:
    a) depositing a magnetic interface layer on top of a barrier layer to form a magnetic tunnel junction (MTJ);
    b) annealing the STTMRAM magnetic tunnel junction film stack with the magnetic interface layer exposed on top at a first temperature;
    c) cooling down the STTMRAM MTJ film stack to a second temperature that is lower than the first temperature; and
    d) continuing depositing a top layer on top of the magnetic interface layer, the top layer being made of a single layer or having a multi-layer structure,
wherein steps a) and b) are carried out without exposing the MTJ film stack to atmospheric environment.

2. A method of manufacturing, as recited in claim 1, wherein the annealing is achieved with a heating element disposed beneath a substrate underlying the STTMRAM magnetic tunnel junction film stack.

3. A method of manufacturing, as recited in claim 2, wherein the heating element is made of a heating block, a heating chuck or a heating plate.

4. A method of manufacturing, as recited in claim 1, wherein the annealing is achieved with a radiation source disposed above the STTMRAM magnetic tunnel junction film stack.

5. A method of manufacturing, as recited in claim 4, wherein the radiation source is a lamp.

6. A method of manufacturing, as recited in claim 4, wherein the radiation source is a laser.

7. A method of manufacturing, as recited in claim 1, wherein the entire cycle time between start of the annealing step and end of the cooling-down step is less than 10 minutes.

8. A method of manufacturing, as recited in claim 7, wherein the entire cycle time is 2 minutes or less.

9. A method of manufacturing, as recited in claim 1, wherein the top layer is made of Co, Fe, B, Pd, Pt, Ta, Ru, Tb, Cr, Mg, O, Cu, Zn, Hf, or any combination thereof.

10. A method of manufacturing, as recited in claim 1, wherein the top layer is made of interlaced magnetic and non-magnetic layers.

11. A method of manufacturing, as recited in claim 1, wherein the magnetic interface layer is made of Co, Fe, Ta, Ti, Ni, Cr, Pt, Pd, Tb, Zn, O, Cu, Zr, or any combination thereof.

12. A method of manufacturing, as recited in claim 1, wherein the magnetic interface layer is composed of a stack of multiple magnetic layers with each of the layers of the multiple magnetic layers having a distinct boron content.

13. A method of manufacturing, as recited in claim 1, wherein the magnetic interface layer is composed of a second multilayer structure that includes magnetic and non-magnetic layers with at least one magnetic layer contacting the barrier layer.

14. A method of manufacturing, as recited in claim 13, wherein the second multilayer structure includes a top surface layer.

15. A method of manufacturing, as recited in claim 14, wherein the top surface layer is made of non-magnetic material.

16. A method of manufacturing, as recited in claim 15, wherein the top surface layer is made of a material comprising at least one element selected from the group consisting of Ta, Pd, Ru, Mg, O, Hf, Tb, Pt, Ti, Cu, and Hf.

17. A method of manufacturing, as recited in claim 14, wherein the top surface layer is made of magnetic material.

18. A method of manufacturing, as recited in claim 17, wherein the top surface layer is made of a material comprising at least one element selected from the group consisting of Co, Fe, B, Ni, Ta, Pd, Ru, Mg, O, Tb, Pt, Ti, Cu, Zr, Mn, Ir, and Hf.

* * * * *